United States Patent
Yasuda

(10) Patent No.: US 11,621,699 B2
(45) Date of Patent: Apr. 4, 2023

(54) ACOUSTIC WAVE FILTER DEVICE AND COMPOSITE FILTER DEVICE

(71) Applicant: Murata Manufacturing Co., Ltd., Nagaokakyo (JP)

(72) Inventor: Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 622 days.

(21) Appl. No.: 16/291,010

(22) Filed: Mar. 4, 2019

(65) Prior Publication Data

US 2019/0199325 A1 Jun. 27, 2019

Related U.S. Application Data

(63) Continuation of application No. PCT/JP2017/032108, filed on Sep. 6, 2017.

(30) Foreign Application Priority Data

Sep. 7, 2016 (JP) .............................. JP2016-174775

(51) Int. Cl.
*H03H 9/64* (2006.01)
*H03H 9/60* (2006.01)
(Continued)

(52) U.S. Cl.
CPC .......... *H03H 9/6483* (2013.01); *H03H 9/542* (2013.01); *H03H 9/582* (2013.01);
(Continued)

(58) Field of Classification Search
CPC ........ H03H 9/542; H03H 9/582; H03H 9/605; H03H 9/6483; H03H 9/706; H03H 9/725; H03H 9/14514; H03H 9/17; H03H 9/54
(Continued)

(56) References Cited

U.S. PATENT DOCUMENTS 5,202,652 A * 4/1993 Tabuchi ............... H03H 9/1455
310/313 R
5,726,610 A * 3/1998 Allen ................... H03H 9/6423
310/313 B
(Continued)

FOREIGN PATENT DOCUMENTS

JP 09-98056 A 4/1997
JP 2004-088143 A 3/2004
(Continued)

OTHER PUBLICATIONS

Official Communication issued in corresponding Japanese Patent Application No. 2018-538441, dated Dec. 24, 2019.
(Continued)

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave filter device includes a second filter section connected to a first filter section. The second filter section includes acoustic wave resonators in a ladder circuit configuration. Of the acoustic wave resonators in the first and second filter sections, the acoustic wave resonator having the smallest fractional bandwidth is included in the second filter section. In the second filter section, inductors are respectively connected between parallel arm resonators and a reference potential. Attenuation near a pass band in the second filter section is larger than attenuation near a pass band in the first filter section.

26 Claims, 11 Drawing Sheets

(51) Int. Cl.
*H03H 9/54* (2006.01)
*H03H 9/58* (2006.01)
*H03H 9/70* (2006.01)
*H03H 9/72* (2006.01)

(52) U.S. Cl.
CPC ............ *H03H 9/605* (2013.01); *H03H 9/706* (2013.01); *H03H 9/725* (2013.01)

(58) Field of Classification Search
USPC .................. 333/133, 189, 193, 194, 195
See application file for complete search history.

(56) References Cited

U.S. PATENT DOCUMENTS

| | | | | |
|---|---|---|---|---|
| 5,999,069 | A * | 12/1999 | Ushiroku | H03H 9/6483 |
| | | | | 333/193 |
| 6,480,075 | B1 * | 11/2002 | Fujita | H03H 9/6483 |
| | | | | 333/193 |
| 8,018,304 | B2 * | 9/2011 | Jian | H03H 9/0514 |
| | | | | 333/189 |
| 8,125,298 | B2 * | 2/2012 | Hara | H03H 9/725 |
| | | | | 333/133 |
| 8,600,316 | B2 * | 12/2013 | Lum | H04B 1/006 |
| | | | | 455/78 |
| 9,685,930 | B2 * | 6/2017 | Bauer | H03H 9/542 |
| 9,762,208 | B2 * | 9/2017 | Xu | H03H 7/0161 |
| 2008/0258983 | A1 * | 10/2008 | Bauer | H03H 9/6493 |
| | | | | 343/722 |
| 2012/0200371 | A1 | 8/2012 | Yamashita | |
| 2012/0293277 | A1 | 11/2012 | Hara et al. | |
| 2014/0035702 | A1 * | 2/2014 | Black | H03H 9/465 |
| | | | | 333/186 |
| 2015/0155850 | A1 * | 6/2015 | Kuzushita | H03H 9/24 |
| | | | | 333/133 |
| 2015/0220665 | A1 * | 8/2015 | Turner | G06F 30/36 |
| | | | | 716/103 |
| 2016/0277002 | A1 | 9/2016 | Nakahashi | |
| 2017/0134005 | A1 * | 5/2017 | Takeuchi | H03H 7/1766 |
| 2017/0294896 | A1 | 10/2017 | Nosaka | |
| 2017/0302252 | A1 * | 10/2017 | Hey-Shipton | H04B 1/3833 |

FOREIGN PATENT DOCUMENTS

| | | |
|---|---|---|
| JP | 2007-202136 A | 8/2007 |
| JP | 2012-169707 A | 9/2012 |
| WO | 2011/096245 A1 | 8/2011 |
| WO | 2013/128636 A1 | 9/2013 |
| WO | 2015/083415 A1 | 6/2015 |
| WO | 2016/117676 A1 | 7/2016 |

OTHER PUBLICATIONS

Official Communication issued in International Patent Application No. PCT/JP2017/032108, dated Nov. 21, 2017.

* cited by examiner

ACOUSTIC WAVE FILTER DEVICE AND COMPOSITE FILTER DEVICE

CROSS REFERENCE TO RELATED APPLICATIONS

This application claims the benefit of priority to Japanese Patent Application No. 2016-174775 filed on Sep. 7, 2016 and is a Continuation Application of PCT Application No. PCT/JP2017/032108 filed on Sep. 6, 2017. The entire contents of each of these applications are hereby incorporated herein by reference.

BACKGROUND OF THE INVENTION

1. Field of the Invention

The present invention relates to an acoustic wave filter device and a composite filter device that include an acoustic wave filter including a ladder circuit.

2. Description of the Related Art

In general, a plurality of band pass filters are connected to an antenna terminal in a cellular phone or the like. For example, an acoustic wave filter device in which one end of each of first and second band pass filters including first and second acoustic wave filters is connected to an antenna terminal is disclosed in Japanese Unexamined Patent Application Publication No. 2004-88143. In Japanese Unexamined Patent Application Publication No. 2004-88143, each of the first and second band pass filters is a ladder filter including a serial arm resonator and a parallel arm resonator.

In the acoustic wave filter device described in Japanese Unexamined Patent Application Publication No. 2004-88143, filter characteristics of one of the first and second band pass filters are influenced by filter characteristics of the other one of the first and second band pass filters. For example, return loss of the first band pass filter observed from the antenna terminal side is large in a pass band of the second band pass filter. In this case, there arises a problem of an increase in insertion loss in the pass band of the second band pass filter.

In recent years, a pass band of a band pass filter in the RF stage of a cellular phone has been required to be widened. To meet the requirement, it has been attempted to widen the band of an acoustic wave filter formed in a ladder circuit configuration by connecting an inductor between a parallel arm resonator and a reference potential, connecting an inductor between a serial arm and the reference potential, or the like.

However, in a configuration in which first and second band pass filters are connected to an antenna terminal at one end side thereof, the design must be taken into consideration not only the band-widening of one of the band pass filters but also the influence on the other of the band pass filters, that is, the partner band pass filter described above. In other words, in the case in which the band-widening is attempted using the above-described inductor, there arises a risk of an increase in return loss outside the pass band to worsen insertion loss in the pass band of the partner band pass filter.

SUMMARY OF THE INVENTION

Preferred embodiments of the present invention provide acoustic wave filter devices each including a plurality of acoustic wave filters with one end of each thereof connected in common, wherein the acoustic wave filter device is capable of band-widening and improving insertion loss in a pass band of the partner filter, and composite filter devices capable of improving insertion loss of bundled band pass filters while widening the band.

An acoustic filter device according to a preferred embodiment of the present invention includes a first filter section including a ladder circuit that includes at least one serial arm resonator and at least one parallel arm resonator wherein the serial arm resonator and the parallel arm resonator are each defined by an acoustic wave resonator; and a second filter section connected to the first filter section and including a ladder circuit that includes at least one serial arm resonator and at least one parallel arm resonator wherein the serial arm resonator and the parallel arm resonator are each defined by an acoustic wave resonator, wherein a fractional bandwidth of the second filter section is smaller than a fractional bandwidth of the first filter section, the first filter section includes or does not include an inductor connected between the parallel arm resonator and a reference potential, the second filter section includes an inductor connected between at least the one parallel arm resonator and the reference potential, and the inductor having the largest inductance value among the inductors each connected between the parallel arm resonator and the reference potential is included in the second filter section.

In an acoustic wave filter device according to a preferred embodiment of the present invention, attenuation in a predetermined attenuation region adjacent to a pass band in the second filter section is larger than attenuation in an attenuation region adjacent to a pass band in the first filter section.

In an acoustic wave filter device according to a preferred embodiment of the present invention, the first filter section and the second filter section each include an inductor connected between at least one parallel arm resonator and a reference potential, and the second filter section includes the inductor having the largest inductance value among the inductors each connected between the parallel arm resonator and the reference potential in the first and second filter sections.

In an acoustic wave filter device according to a preferred embodiment of the present invention, any inductance value of the inductors provided in the second filter section is larger than any inductance value of the inductors provided in the first filter section.

In an acoustic wave filter device according to a preferred embodiment of the present invention, of the inductors provided in the second filter section, the inductor located farthest from the first filter section has the largest inductance value.

In an acoustic wave filter device according to a preferred embodiment of the present invention, the second filter section includes the acoustic wave resonator with the smallest fractional bandwidth, in the first and second filter sections.

An acoustic wave filter device according to a preferred embodiment of the present invention includes a first filter section which is an LC filter including at least one inductor and at least one capacitor; and a second filter section connected to the first filter section and including a ladder circuit that includes at least one serial arm resonator and at least one parallel arm resonator wherein the serial arm resonator and the parallel arm resonator are each defined by an acoustic wave resonator, wherein a fractional bandwidth of the second filter section is smaller than a fractional bandwidth of the first filter section.

In an acoustic wave filter device according to a preferred embodiment of the present invention, attenuation in a predetermined attenuation region adjacent to a pass band in the second filter section is larger than attenuation in an attenuation region adjacent to a pass band in the first filter section.

An acoustic wave filter device according to a preferred embodiment of the present invention includes a first filter section including a ladder circuit; and a second filter section connected to the first filter section and including a ladder circuit that includes at least one serial arm resonator and at least one parallel arm resonator wherein the serial arm resonator and the parallel arm resonator are each defined by an acoustic wave resonator, wherein an inductor connected between a serial arm and a reference potential is further provided in the second filter section.

In an acoustic wave filter device according to a preferred embodiment of the present invention, attenuation in a predetermined attenuation region adjacent to a pass band in the second filter section is larger than attenuation in an attenuation region adjacent to a pass band in the first filter section.

In an acoustic wave filter device according to a preferred embodiment of the present invention, the first filter section includes the ladder circuit including the acoustic wave resonator.

In an acoustic wave filter device according to a preferred embodiment of the present invention, the second filter section includes the acoustic wave resonator with the smallest fractional bandwidth, in the first and second filter sections.

In an acoustic wave filter device according to a preferred embodiment of the present invention, the first filter section does not include an inductor connected between a serial arm and the reference potential.

In an acoustic wave filter device according to a preferred embodiment of the present invention, the first filter section includes an inductor connected between the serial arm and the reference potential without another element interposed between the stated inductor and the serial arm or the reference potential, and the first filter section includes the inductor having the largest inductance value among the inductors each connected between the serial arm and the reference potential in the first and second filter sections.

In an acoustic wave filter device according to a preferred embodiment of the present invention, any inductance value of the inductors each connected between the serial arm and the reference potential without another element interposed between the inductor and the serial arm or the reference potential in the first filter section is larger than any inductance value of the inductors each connected between the serial arm and the reference potential without another element interposed between the inductor and the serial arm or the reference potential in the second filter section.

In an acoustic wave filter device according to a preferred embodiment of the present invention, the first filter section is an LC filter including at least one inductor and at least one capacitor.

In an acoustic wave filter device according to a preferred embodiment of the present invention, the first filter section includes the ladder circuit including the acoustic wave resonators, and any fractional bandwidth of the acoustic wave resonators provided in the first filter section is larger than the fractional bandwidth of the acoustic wave resonator provided in the second filter section.

In an acoustic wave filter device according to a preferred embodiment of the present invention, each of the first and second filter sections is a surface acoustic wave filter.

In an acoustic wave filter device according to a preferred embodiment of the present invention, the first filter section includes the ladder circuit including the acoustic wave resonators, and an acoustic wave mode used in the first filter section differs from an acoustic wave mode used in the second filter section.

In an acoustic wave filter device according to a preferred embodiment of the present invention, the first and second filter sections each include a piezoelectric body and an electrode provided on the piezoelectric body, and the first filter section differs from the second filter section in at least one of a material of the electrode, a material of the piezoelectric body, a composition ratio of the material of the piezoelectric body, a crystal orientation of the piezoelectric body, and a cut-angle of the piezoelectric body.

In an acoustic wave filter device according to a preferred embodiment of the present invention, the first and second filter sections each include a piezoelectric body, an electrode provided on the piezoelectric body and a dielectric film that covers the electrode, and the first filter section differs from the second filter section in at least either one of a thickness of the electrode and a thickness of the dielectric film.

A composite filter device according to a preferred embodiment of the present invention includes a plurality of band pass filters connected in common at one end of each thereof, wherein at least one of the plurality of band pass filters is an acoustic wave filter device according to a preferred embodiment of the present invention, and includes a first band pass filter having a first pass band and a second band pass filter having a second pass band different from the first pass band, and the second pass band is positioned on a higher frequency side than the first pass band.

A composite filter device according to a preferred embodiment of the present invention includes a plurality of band pass filters connected in common at one end of each thereof, wherein at least one of the plurality of band pass filters is an acoustic wave filter device according to a preferred embodiment of the present invention, and includes a first band pass filter having a first pass band and a second band pass filter having a second pass band different from the first pass band, and the second pass band is positioned on a lower frequency side than the first pass band.

A composite filter device according to a preferred embodiment of the present invention includes a plurality of band pass filters connected in common at one end of each thereof, wherein at least one of the plurality of band pass filters is an acoustic wave filter device according to a preferred embodiment of the present invention, and includes a first band pass filter having a first pass band and a second band pass filter having a second pass band different from the first pass band.

With the acoustic wave filter devices according to preferred embodiments of the present invention, insertion loss is improved while the band is widened. As such, when bundled with another band pass filter, insertion loss of the other band pass filter being bundled is improved.

With the composite filter devices according to preferred embodiments of the present invention, because the first band pass filter is defined by an acoustic wave filter device according to a preferred embodiment of the present invention, insertion loss of other band pass filter being bundled is improved and the band is widened.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

It is to be noted that the preferred embodiments described in the present specification are merely examples, and that configurations may be partially replaced or combined with each other between different preferred embodiments.

Figure 1:
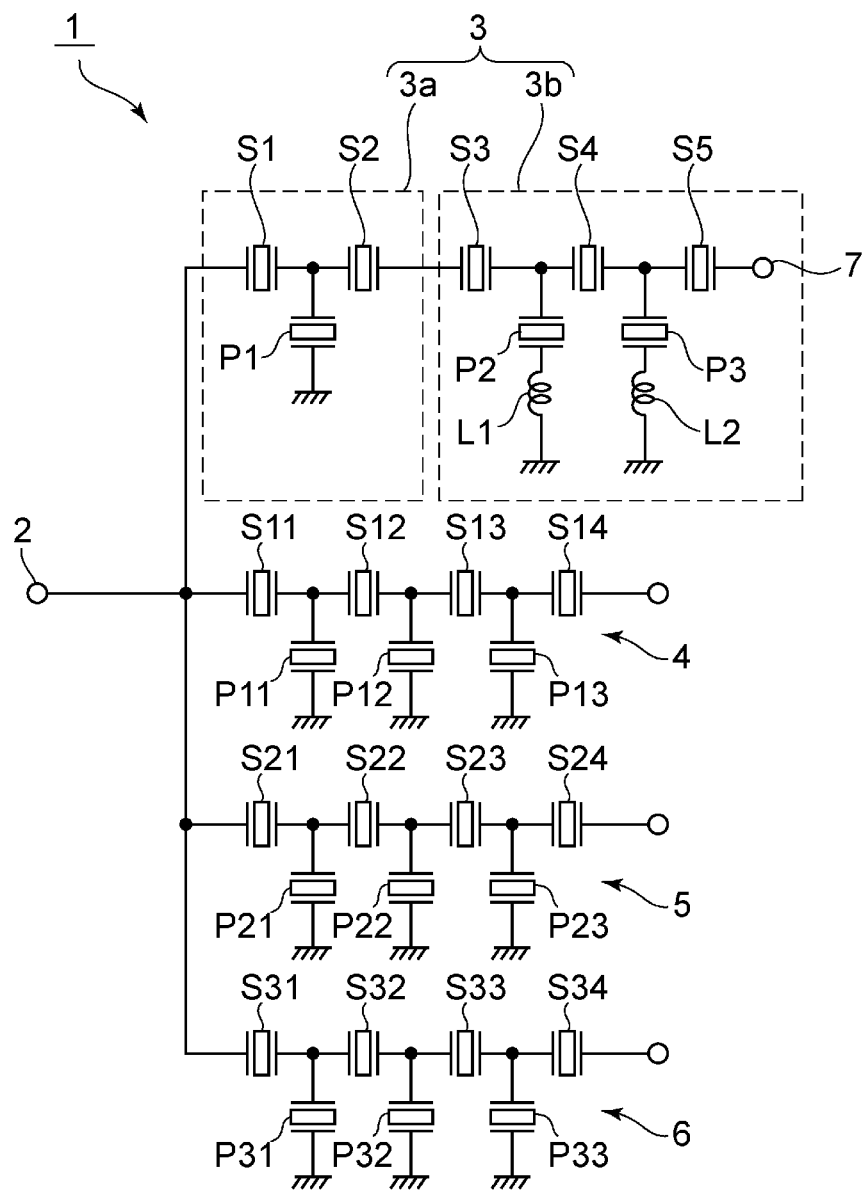
FIG. 1 is a circuit diagram of a composite filter device according to a first preferred embodiment of the present invention.

FIG. 1 is a circuit diagram of a composite filter device according to a first preferred embodiment of the present invention.

A composite filter device 1 is preferably a filter device used in the RF stage of a cellular phone, for example. The composite filter device 1 includes an antenna terminal 2 to be connected to an antenna. One end of each of first to fourth band pass filters 3 to 6 is connected to the antenna terminal 2. The first to fourth band pass filters 3 to 6 are bundled at the one ends thereof and connected to the antenna terminal 2. Pass bands of the first to fourth band pass filters 3 to 6 are different from one another. In the present preferred embodiment, the pass band of the first band pass filter 3 preferably ranges from about 2300 MHz to about 2370 MHz, for example. The pass band of the second band pass filter 4 preferably ranges from about 2496 MHz to about 2690 MHz, for example. Meanwhile, the pass band of the third band pass filter 5 preferably ranges from about 2110 MHz to about 2200 MHz, for example. The pass band of the fourth band pass filter 6 preferably ranges from about 1475.9 MHz to about 2025 MHz, for example.

The first to fourth band pass filters 3 to 6 each include a plurality of serial arm resonators and a plurality of parallel arm resonators. In other words, the first to fourth band pass filters 3 to 6 each include a ladder circuit. The serial arm resonators and the parallel arm resonators are preferably defined by acoustic wave resonators.

The first band pass filter 3 corresponds to one preferred embodiment of an acoustic wave filter device of the present invention.

The first band pass filter 3 includes a first filter section 3a connected to the antenna terminal 2, and a second filter section 3b connected to the first filter section 3a. Each of the first and second filter sections 3a and 3b is an acoustic wave filter. The first band pass filter 3 is connected between the antenna terminal 2 and a terminal 7 as a transmission terminal.

The first filter section 3a includes serial arm resonators S1 and S2, and a parallel arm resonator P1. The second filter section 3b includes serial arm resonators S3 to S5, and parallel arm resonators P2 and P3. Inductors L1 and L2 are connected between the parallel arm resonator P2 and a reference potential and between the parallel arm resonator P3 and the reference potential, respectively. The connection of the inductors L1 and L2 widens a pass band of the second filter section 3b. With this structure, the band pass of the first band pass filter 3 is widened.

In the first band pass filter 3, the second filter section 3b includes an acoustic wave resonator having the smallest fractional bandwidth. The fractional bandwidth of the acoustic wave resonator is represented by a value obtained by dividing a frequency difference between an anti-resonant frequency and a resonant frequency by the resonant frequency. More specifically, of the acoustic wave resonators defining the serial arm resonators S1, S2 and the parallel arm resonator P1 included in the first filter section 3a, and the serial arm resonators S3 to S5 and the parallel arm resonators P2, P3 included in the second filter section 3b, the acoustic wave resonator having the smallest fractional bandwidth corresponds to any one of the serial arm resonators S3 to S5 and the parallel arm resonators P2, P3.

Because of this, attenuation in an attenuation region adjacent to the pass band is large in the second filter section 3b compared to the first filter section 3a. In a reception filter, the attenuation region refers to a transmission band of the same communication band, a transmission band of a different communication band, or a transmission band in another system, such as WiFi, for example. In a transmission filter, the attenuation region refers to a reception band of the same communication band, a reception band of a different communication band, or a reception band in another system, such as WiFi, for example.

As described above, in the first filter section 3a and the second filter section 3b, of the inductors each connected between the parallel arm resonator and the reference potential, the inductor having the largest inductance value is included in the second filter section 3b.

In the second filter section 3b, the inductors L1 and L2 are provided between the parallel arm resonator P2 and the reference potential and between the parallel arm resonator P3 and the reference potential, respectively. In the first filter section 3a, no inductor is connected between the parallel arm resonator P1 and the reference potential. In this manner, in the case in which no inductor is connected between the parallel arm resonator and the reference potential, an inductance value between the parallel arm resonator and the reference potential is preferably approximately 0 nH to a few nH, for example. Note that, however, an inductor may be connected between the parallel arm resonator P1 and the reference potential in order to widen the band. In any case, it is sufficient that, in the first and second filter sections 3a and 3b, the second filter section 3b is provided with the inductor connected between the parallel arm resonator and the reference potential.

The above-described configuration of the first band pass filter 3 makes it possible to widen the pass band. In addition, because the first and second filter sections 3a and 3b are configured in the manner described above, the return loss of the first band pass filter 3 observed from the antenna terminal 2 is able to be reduced. Here, in the first band pass filter 3, it is preferable that, of the inductors each connected between the parallel arm resonator and the reference potential, the inductor located farthest from the antenna terminal 2 has the largest inductance value. To be more specific, it is preferable in the present preferred embodiment that, in the second filter section 3b, the inductance value of the inductor L2 provided farthest from the first filter section 3a is larger than the inductance value of the inductor L1. This makes it possible to further reduce the return loss of the first band pass filter 3 observed from the antenna terminal 2 side.

The second band pass filter 4 is a band pass filter having a ladder circuit configuration including serial arm resonators S11 to S14 and parallel arm resonators P11 to P13. Similarly, the third band pass filter 5 is also a band pass filter having a ladder circuit configuration including serial arm resonators S21 to S24 and parallel arm resonators P21 to P23.

The fourth band pass filter 6 is also a band pass filter having a ladder circuit configuration including a plurality of serial arm resonators S31 to S34 and a plurality of parallel arm resonators P31 to P33.

The pass band of the first band pass filter 3 is denoted as a first pass band, and the pass band of the second band pass filter 4 is denoted as a second pass band.

The inductors L1 and L2 are provided in the first band pass filter 3 as described above, which makes it possible to widen the pass band. In addition, the return loss of the first band pass filter 3 at the second pass band (of the second band pass filter 4) is reduced when observed from the antenna terminal 2. This is because the second filter section 3b includes the acoustic wave resonator with the smallest fractional bandwidth and the attenuation in the attenuation region adjacent to the pass band is larger in the second filter section 3b than the attenuation in the first filter section 3a. This point will be explained below with reference to FIGS. 2 to 6.

Figure 2:
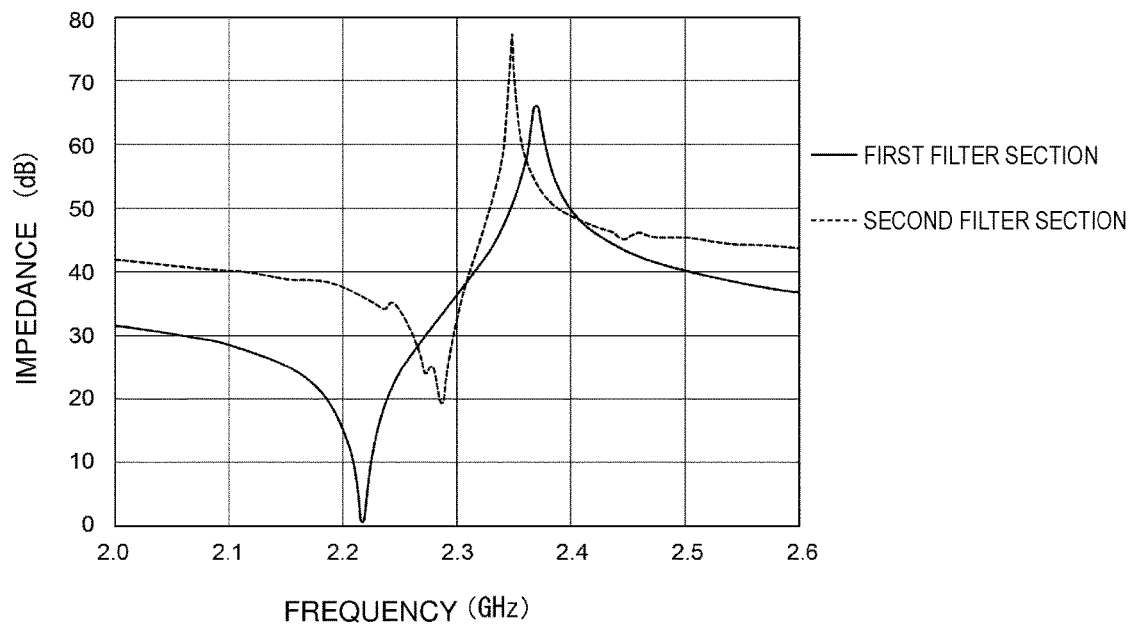
FIG. 2 is a graph showing resonance characteristics of acoustic wave resonators respectively used in first and second filter sections in the first preferred embodiment of the present invention.

A solid line in FIG. 2 indicates resonance characteristics of an acoustic wave resonator in the first filter section 3a, while a broken line indicates resonance characteristics of an acoustic wave resonator in the second filter section 3b. In this case, the resonance characteristics of the parallel arm resonator P1 and the resonance characteristics of the parallel arm resonator P2 are shown. The parallel arm resonator P2 in the second filter section 3b is an acoustic wave resonator having a smaller fractional bandwidth than the parallel arm resonator P1. Similarly, the serial arm resonators S3, S4, and S5 are acoustic wave resonators each having a smaller fractional bandwidth than the serial arm resonators S1 and S2.

Although the parallel arm resonators P2 and P3 have the smallest fractional bandwidth, the band-widening is achieved because the inductors L1 and L2 are connected to the parallel arm resonators P2 and P3 respectively.

Figure 3:
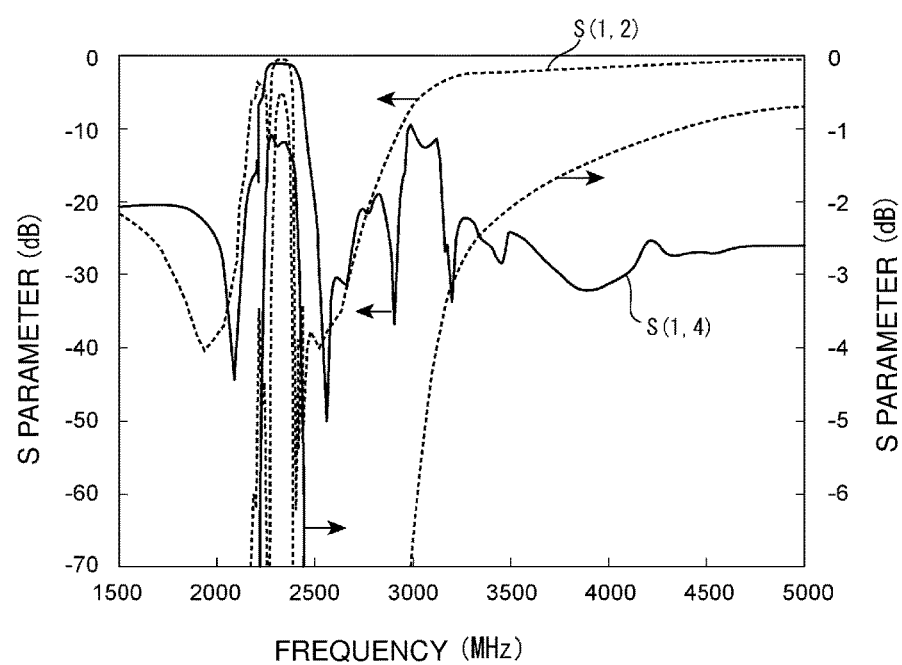
FIG. 3 is a graph showing S (Scattering) parameter characteristics of the first filter section and the second filter section in the first preferred embodiment of the present invention.
Figure 4:
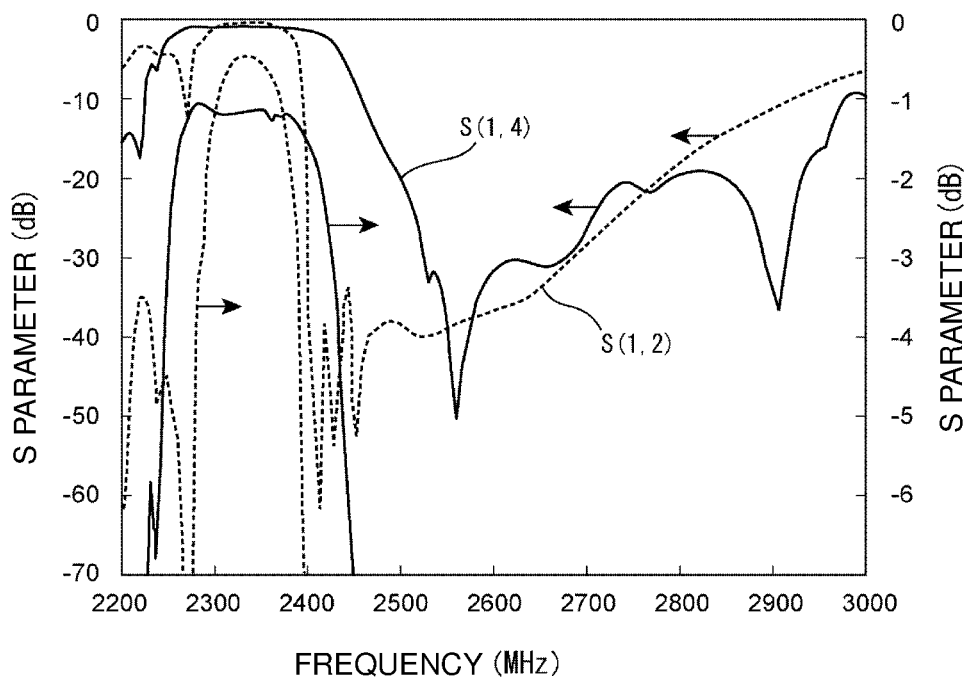
FIG. 4 is a graph in which the S parameter characteristics shown in FIG. 3 are enlarged and shown.
Figure 5:
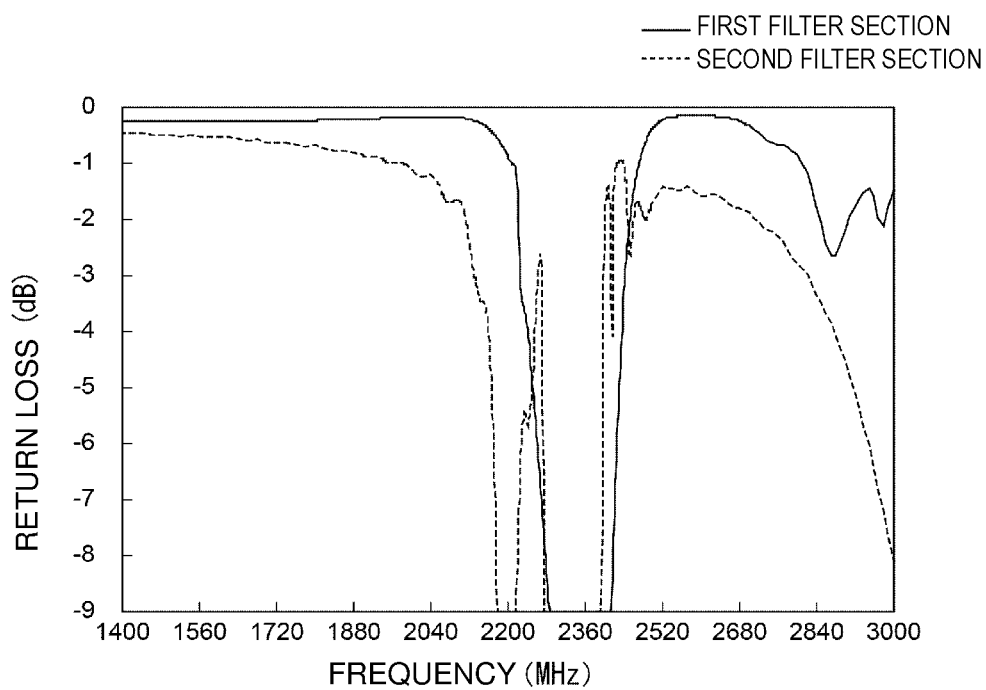
FIG. 5 is a graph showing return loss of the first filter section and the second filter section in the first preferred embodiment of the present invention when observed from an antenna terminal.

FIG. 3 is a graph showing S (Scattering) parameter characteristics of the first filter section and the second filter section in the first preferred embodiment. FIG. 4 is a graph in which the S parameter characteristics shown in FIG. 3 are enlarged and shown. FIG. 5 is a graph showing return loss of the first filter section and the second filter section in the first preferred embodiment when observed from the antenna terminal. The parameter characteristics are obtained by measuring transmission characteristics and return loss with a network analyzer. Here, an S (1, 2) parameter in FIGS. 3 and 4 indicated by a solid line represents frequency characteristics of the first filter section, while an S (1, 2) parameter indicated by a broken line represents frequency characteristics of the second filter section. In FIG. 5, a solid line indicates return loss of the first filter section, while a broken line indicates return loss of the second filter section. In the S (1, 2) parameter frequency characteristics shown in FIGS. 3 and 4, attenuation is remarkably small in a frequency range of about 2300 MHz to about 2370 MHz as the first pass band. On the other hand, sufficient attenuation is provided in a frequency range of about 2402 MHz to about 2472 MHz as the attenuation band adjacent to the first pass band, and in a frequency range of about 2496 MHz to about 2690 MHz as the second pass band. With this configuration, as shown in FIG. 5, the return loss observed from the antenna terminal 2 is small in the second pass band. As such, it is understood that, in the first band pass filter 3, while widening the band by connecting the inductors L1 and L2, insertion loss in the second pass band of the second band pass filter 4, which is a partner band pass filter to be connected in common, is able to be improved.

Figure 6:
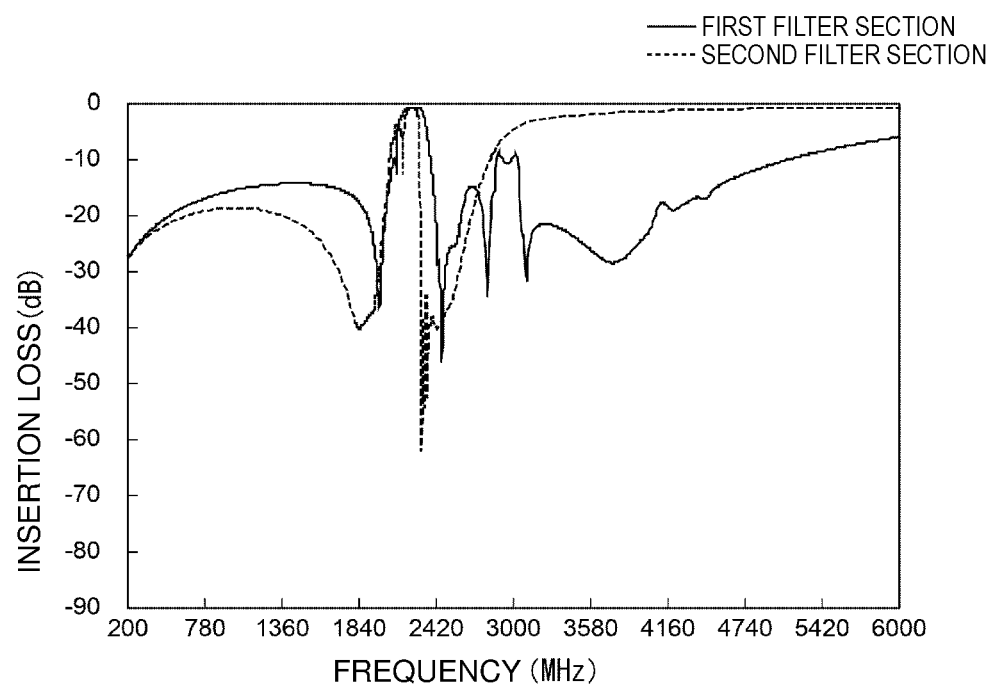
FIG. 6 is a graph showing a relationship between filter characteristics of the first and second filter sections in the first preferred embodiment of the present invention.

FIG. 6 is a graph showing a relationship between filter characteristics of the first and second filter sections in the first preferred embodiment. In FIG. 6, a solid line indicates filter characteristics of the first filter section 3a, while a broken line indicates filter characteristics of the second filter section 3b.

As indicated by the broken line, because the second filter section 3b includes acoustic wave resonators with small fractional bandwidths, a sufficiently large amount of attenuation is provided in the attenuation region adjacent to the pass band. Accordingly, steepness of attenuation characteristics near the pass band is improved in the second filter section 3b.

However, a sufficient amount of attenuation is not provided in the second filter section 3b in a frequency range spaced from the pass band, that is, at a position toward a higher frequency side relative to the pass band in FIG. 6. In contrast, a sufficiently large amount of attenuation is secured in the first filter section 3a in a frequency range toward a higher frequency side relative to the pass band.

Accordingly, in the first band pass filter 3 of the composite filter device 1, the attenuation at a higher frequency side relative to the first pass band is sufficiently large while widening the band. Due to this, the attenuation in the second pass band positioned on a higher frequency side relative to the first pass band is sufficiently large. As a result, as shown in FIG. 5, the return loss of the first band pass filter 3 at the second pass band (of the second band pass filter 4) is able to be reduced when observed from the antenna terminal 2. This makes it possible to improve the insertion loss of the second band pass filter 4.

In the present preferred embodiment, each of the acoustic wave resonators of the first filter section 3a preferably uses Love waves propagating in a LiNbO$_3$ substrate, for example. On the other hand, each of the acoustic wave resonators of the second filter section 3b preferably uses Leaky waves propagating in a LiTaO$_3$ substrate or Rayleigh waves propagating in a LiNbO$_3$ substrate, for example.

Note that a method for making the fractional bandwidths of the acoustic wave resonators different between the first filter section 3a and the second filter section 3b is not limited to the method in which an acoustic wave mode used in the first filter section 3a is different from an acoustic wave mode used in the second filter section 3b as described above. In a configuration in which the first filter section 3a and the second filter section 3b each include a piezoelectric body and an electrode provided on the piezoelectric body, the first filter section 3a may differ from the second filter section 3b in at least one of a material of the electrode, a material of the piezoelectric body, a composition ratio of the material of the piezoelectric body, a crystal orientation of the piezoelectric body, and a cut-angle of the piezoelectric body, for example. The above-described case in which the composition ratio of the material of the piezoelectric body is different refers to a situation in which, in a case of the piezoelectric body being made of a composite material, composition ratios of the composite materials of the piezoelectric bodies in the first filter section 3a and the second filter section 3b are different from each other. More specifically, in a case in which the piezoelectric body is made of a composite material in which aluminum nitride is doped with scandium, for example, the ratios of aluminum nitride and scandium in the first filter section 3a and the second filter section 3b are different from each other.

In a configuration in which a dielectric film is further provided to cover the electrode provided on the piezoelectric body, at least one of an electrode thickness and a dielectric film thickness may differ between the first filter section 3a and the second filter section 3b.

In the above-described preferred embodiment, although the first and second filter sections 3a and 3b preferably use the surface acoustic wave as mentioned above, a BAW (Bulk Acoustic Wave) may be used as an acoustic wave.

Further, in the above-described preferred embodiment, although the fractional bandwidth of the serial arm resonator S1 provided in the first filter section 3a is larger than the fractional bandwidth of the serial arm resonator S3 in the second filter section 3b, all of the fractional bandwidths of the acoustic wave resonators provided in the first filter section 3a may be larger than the fractional bandwidths of the acoustic wave resonators provided in the second filter section 3b. In other words, the configuration may be such that the fractional bandwidths of the serial arm resonators S1 and S2 are larger than any of the fractional bandwidths of the serial arm resonators S3 to S5. In such case, attenuation near the pass band is able to be even larger in the second filter section 3b.

That is, it is preferable that the acoustic wave resonator with the smallest fractional bandwidth is provided in the second filter section 3b. Further, it is preferable that the fractional bandwidth in the first filter section 3a of the acoustic wave resonator with the smallest fractional bandwidth is larger than the fractional bandwidth of the acoustic wave resonator having the largest fractional bandwidth among the acoustic wave resonators in the second filter section 3b.

This configuration makes it possible to cause the fractional bandwidth of the first filter section 3a to be larger than the fractional bandwidth of the second filter section 3b. The fractional bandwidth of the filter is represented by dividing the pass band width by the center frequency.

Note that in the above-described preferred embodiment, the configuration of each inductor is not limited to any specific configuration. The inductor may be a chip or may be an electrode pattern, for example. The layout of the inductors is also not limited to any specific layout. For example, in a configuration in which the first filter section 3a and the second filter section 3b each include a piezoelectric body and an electrode provided on the piezoelectric body, each of the inductors may be provided on the piezoelectric body. Alternatively, in a configuration in which the composite filter device 1 includes a wiring substrate aside from the piezoelectric body (bodies) of the acoustic wave resonators, and the acoustic wave resonators are electrically connected to the wiring on the wiring substrate, the inductors may be provided on the wiring substrate. In the case in which the wiring substrate is a multilayer substrate and the inductors are defined by electrode patterns, the inductors may be provided in an internal layer of the wiring substrate.

Figure 7:
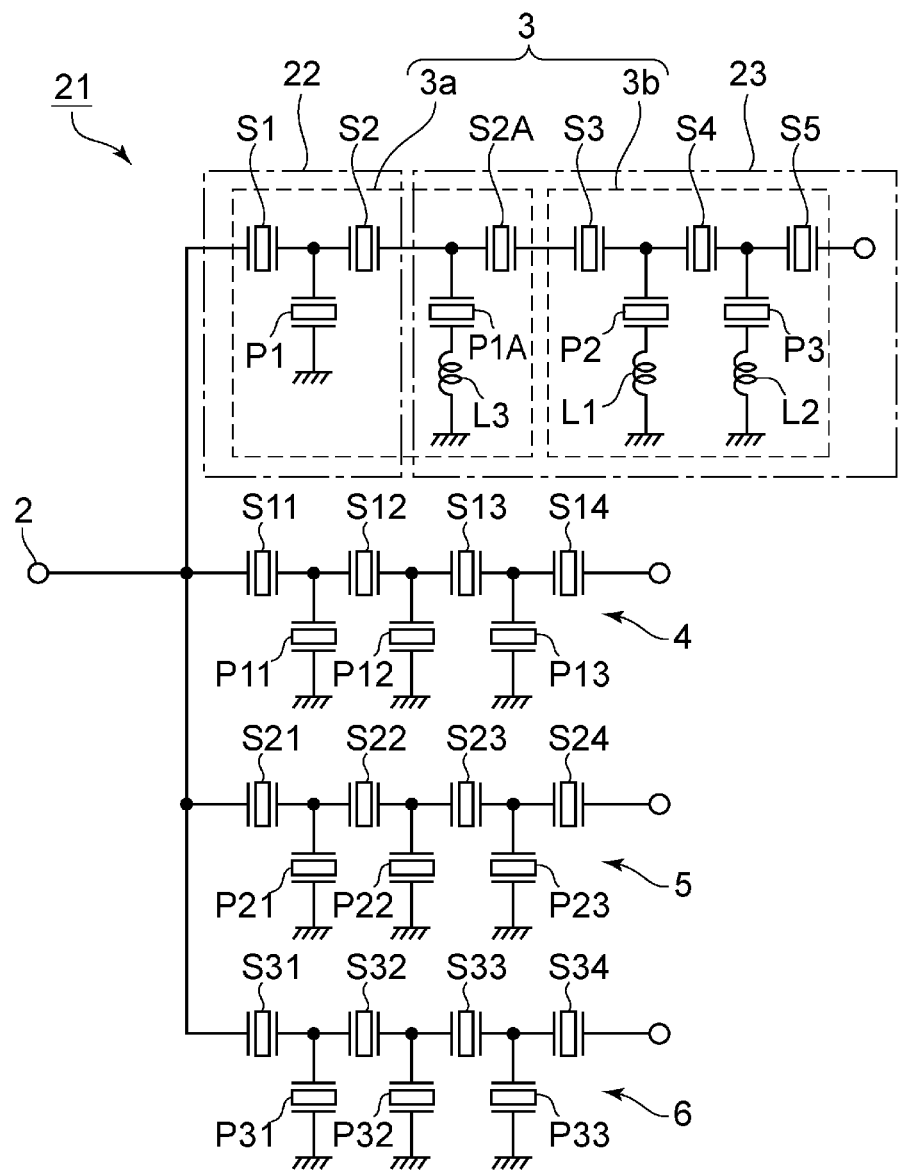
FIG. 7 is a circuit diagram of a composite filter device according to a second preferred embodiment of the present invention.

FIG. 7 is a circuit diagram of a composite filter device according to a second preferred embodiment of the present invention.

In a composite filter device 21 according to the second preferred embodiment, a second filter section 3b is configured in the same manner as the second filter section 3b of the composite filter device 1 in the first preferred embodiment. In contrast, a first filter section 3a in the second preferred embodiment includes a serial arm resonator S2A in addition to the serial arm resonators S1 and S2 included in the first filter section 3a of the first preferred embodiment, and also includes a parallel arm resonator P1A and an inductor L3.

As discussed above, the band may be widened in the first filter 3a by providing the inductor L3 connected between the parallel arm resonator P1A and a reference potential in the first filter section 3a. It is sufficient that either one of the inductance values of the inductors L1 and L2 provided in the second filter section 3b is larger than the inductance value of the inductor L3 provided in the first filter section 3a.

As schematically indicated by a dot-dash line in FIG. 7, a first band pass filter 3 includes first and second acoustic wave chips 22 and 23 in the composite filter device 21. A portion of the first filter section 3a is provided in the first acoustic wave chip 22. Another portion of the first filter section 3a and the second filter section 3b are provided in the second acoustic wave chip 23.

Note that the entire first band pass filter 3 may be provided in a single acoustic wave chip. Alternatively, the first filter section 3a may be provided in a single acoustic wave chip, and the second filter section 3b may be provided in another single acoustic wave chip. In other words, a boundary between the acoustic wave chips defining the first band pass filter 3 may be different from a boundary between the first and second filter sections 3a and 3b.

The composite filter device 21 of the second preferred embodiment is the same or substantially the same as the composite filter device 1 of the first preferred embodiment in the remaining configuration. Accordingly, the same or similar elements are assigned the same reference signs and description thereof is omitted.

Figure 8:
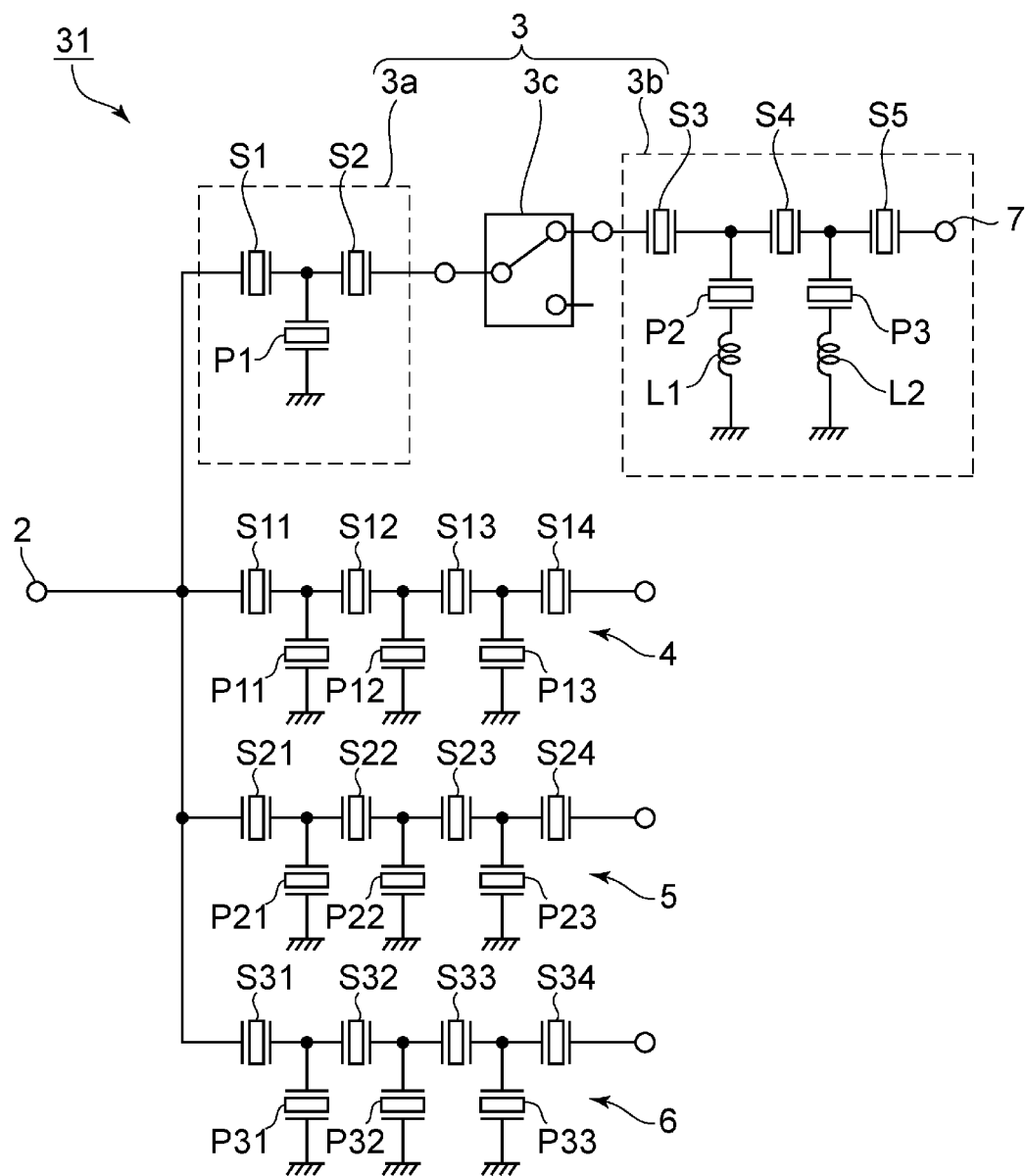
FIG. 8 is a circuit diagram of a composite filter device according to a third preferred embodiment of the present invention.

FIG. 8 is a circuit diagram of a composite filter device according to a third preferred embodiment of the present invention. In a composite filter device 31 according to the third preferred embodiment, a switch 3c is provided between a first filter section 3a and a second filter section 3b in a first band pass filter 3. In this manner, another element, such as a switch or a capacitance coupling portion, may be provided between the first filter section 3a and the second filter section 3b in the first band pass filter 3.

Figure 9:
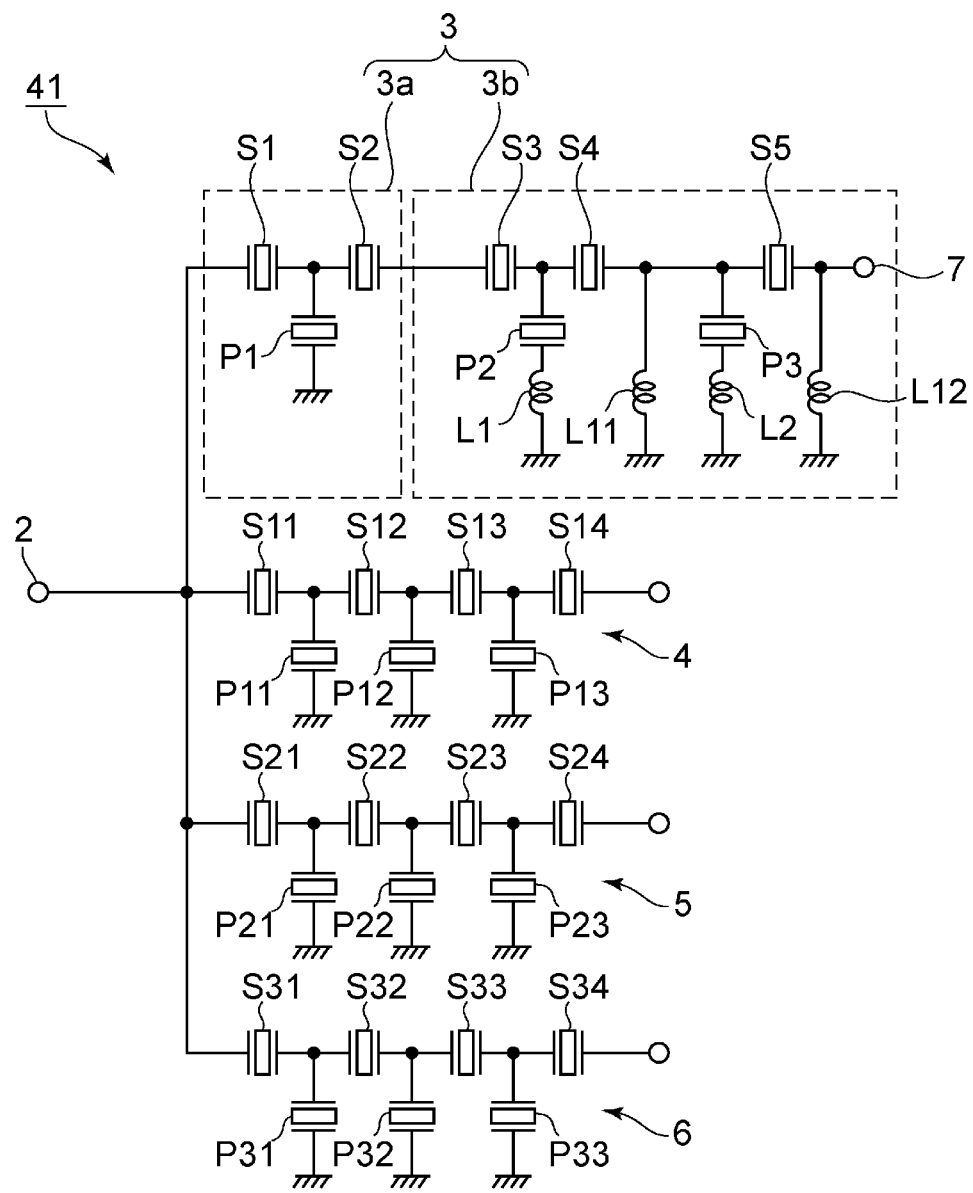
FIG. 9 is a circuit diagram of a composite filter device according to a fourth preferred embodiment of the present invention.

FIG. 9 is a circuit diagram of a composite filter device according to a fourth preferred embodiment of the present invention. A composite filter device 41 according to the fourth preferred embodiment includes, as in the composite filter device 1 of the first preferred embodiment, the first to fourth band pass filters 3 to 6. The first band pass filter 3 corresponds to one preferred embodiment of the acoustic wave filter device according to the present invention, and the composite filter device 41 corresponds to one preferred embodiment of the composite filter device according to the present invention.

In the present preferred embodiment, preferably, the pass band of the first band pass filter 3 ranges from about 2496 MHz to about 2690 MHz, the pass band of the second band pass filter 4 ranges from about 1475.9 MHz to about 2025 MHz, the pass band of the third band pass filter 5 ranges from about 2110 MHz to about 2200 MHz, and the pass band of the fourth band pass filter 6 ranges from about 2300 MHz to about 2370 MHz, for example. As such, the pass band of the first band pass filter 3 is higher in frequency than the pass band of the second band pass filter 4 in the present preferred embodiment, whereas the pass band of the first band pass filter 3 is lower in frequency than the pass band of the second band pass filter 4 in the first preferred embodiment.

The first band pass filter 3 includes a first filter section 3a and a second filter section 3b. The configuration of the first filter section 3a of the present preferred embodiment is similar to that of the first filter section 3a in the first preferred embodiment.

A different point is as follows: the second filter section 3b includes shunt type inductors L11 and L12, in addition to the serial arm resonators S3 to S5 defined by the acoustic wave resonators, the parallel arm resonators P2 and P3 also defined by the acoustic wave resonators, and the inductor L1.

The inductor L11 is connected between a serial arm and a reference potential. In other words, the inductor L11 is connected between the reference potential and a portion of the serial arm at which the serial arm resonators S4 and S5 are connected. The inductor L12 is connected between the reference potential and a portion of the serial arm at which the serial arm resonator S5 and the terminal 7 are connected.

Other elements of the first band pass filter 3 are the same as or similar to those of the first band pass filter 3 of the first preferred embodiment.

Also in the present preferred embodiment, the acoustic wave resonator having the smallest fractional bandwidth is included in the second filter section 3b. The fractional bandwidth of the second filter section 3b is smaller than that of the first filter section 3a, and attenuation near the pass band is larger in the second filter section 3b than that in the first filter section 3a.

With the inductors L1 and L2 being provided, the fractional bandwidth in the second filter section 3b is widened. In addition, the first filter section 3a includes the serial arm resonators S1, S2 and the parallel arm resonator P1, and a sufficiently large amount of attenuation is provided at a high frequency side equal to or higher than the LC resonant frequency in this first filter section 3a.

Moreover, in the present preferred embodiment, with the inductors L11 and L12 being connected, a sufficient amount of attenuation is provided at a frequency side lower than the first pass band. As such, a sufficiently large amount of attenuation is provided in the second pass band.

In the present preferred embodiment, the pass band is widened due to the connection of the inductors L11 and L12. In the first filter section 3a, the fractional bandwidth of each of the acoustic wave resonators of the serial arm resonators S1, S2 and the parallel arm resonator P1 is large. Further, return loss in the second pass band is small because of the inductors L11 and L12 are not provided. Accordingly, also in the composite filter device 41, the band is able to be widened in the first band pass filter 3, and the insertion loss is able to be improved in the second band pass filter 4.

Although, in the present preferred embodiment, the inductor L1 is provided in the first band pass filter 3, the inductor L1 may not be provided. Also in the present preferred embodiment, in the case in which the inductor L1 is provided in the second filter section 3b, an inductor connected between the parallel arm resonator P1 and the reference potential may be provided at the first filter section 3a side as well. In such case, it is preferable for the inductor connected to the reference potential in the first filter section 3a to have a smaller inductance value than the inductance value of the inductor L1 in the second filter section 3b.

Figure 10:
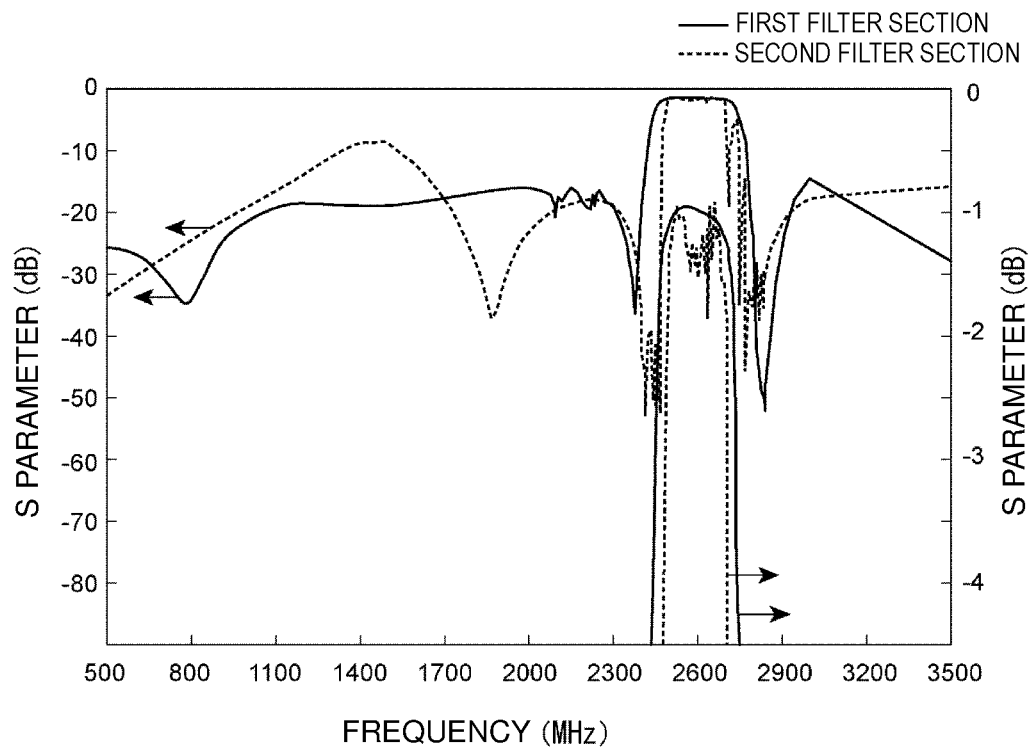
FIG. 10 is a graph showing S12 parameter frequency characteristics of first and second filter sections in the fourth preferred embodiment of the present invention.
Figure 11:
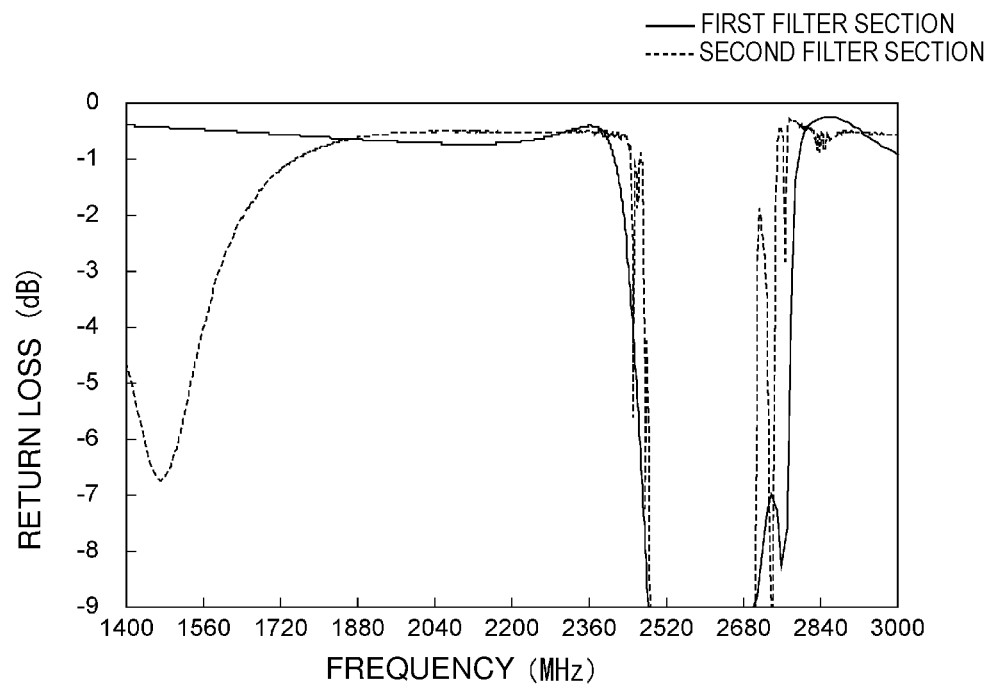
FIG. 11 is a graph showing return loss of the first filter section and the second filter section in the fourth preferred embodiment of the present invention when observed from an antenna terminal.

FIG. 10 is a graph showing S12 parameter frequency characteristics of the first and second filter sections in the fourth preferred embodiment. FIG. 11 is a graph showing return loss of the first filter section and the second filter section in the fourth preferred embodiment when observed from the antenna terminal. In FIGS. 10 and 11, a solid line indicates a result of the first filter section 3a, while a broken line indicates a result of the second filter section 3b. As is clear from FIG. 10, attenuation is sufficiently small in a band of about 2496 MHz to about 2690 MHz, which is a pass band of the first band pass filter 3. Further, attenuation is sufficiently large in a frequency range of about 2402 MHz to about 2472 MHz, which is an adjacent attenuation band, and in a frequency range of about 1475.9 MHz to about 2025 MHz, which is the second pass band of the second band pass filter 4 as a partner filter.

As is clear from FIG. 10, the attenuation is sufficiently large near the pass band in the second filter section 3b. Accordingly, attenuation characteristics near the pass band are improved.

As indicated by the solid line, in the filter characteristics of the first filter section 3a, the attenuation on the lower frequency side relative to the pass band is sufficiently large. Further, as shown in FIG. 11, return loss in the second pass band is small. As such, the insertion loss in the second pass band of the second band pass filter 4 is able to be improved.

Figure 12:
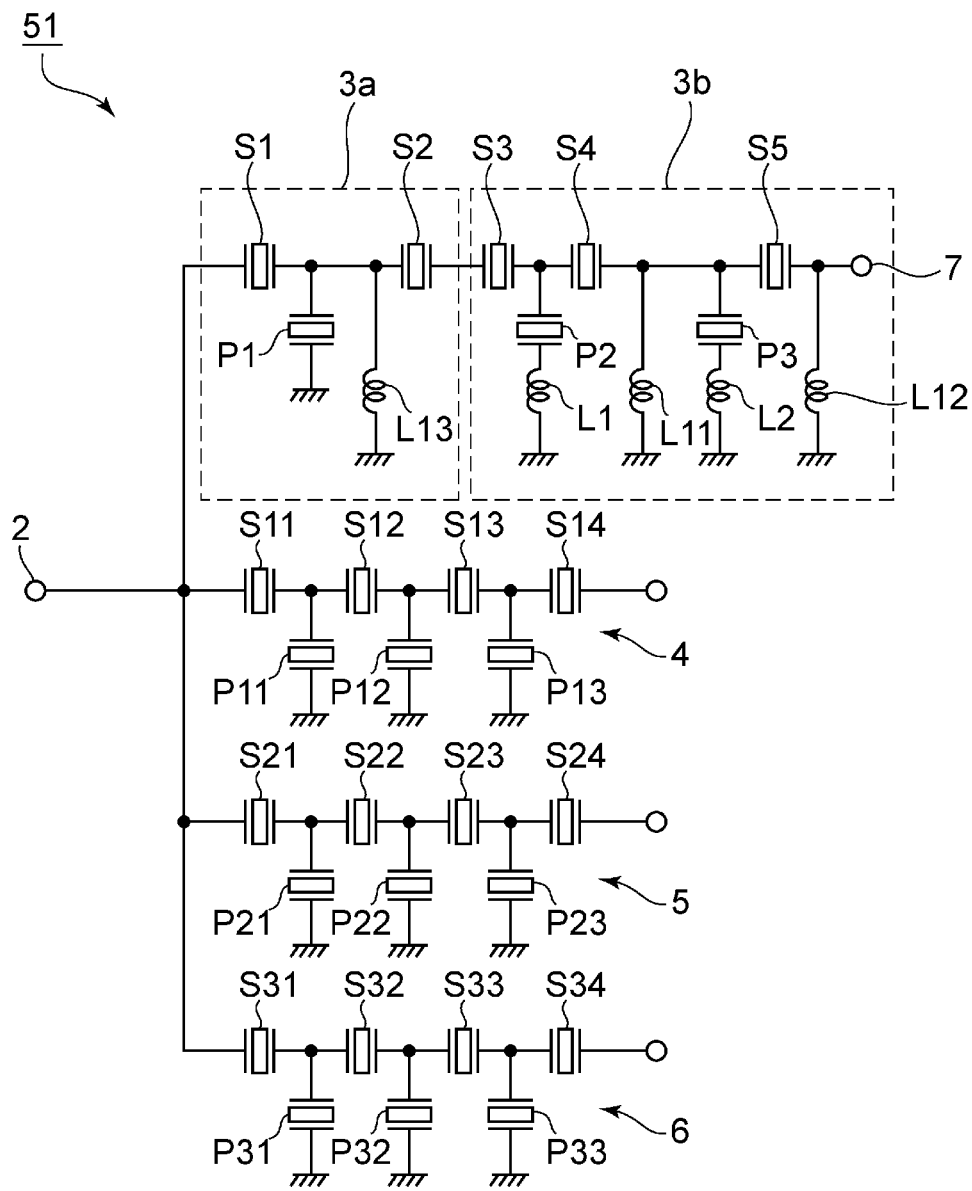
FIG. 12 is a circuit diagram of a composite filter device according to a fifth preferred embodiment of the present invention.

FIG. 12 is a circuit diagram of a composite filter device according to a fifth preferred embodiment of the present invention.

In a composite filter device 51 according to the fifth preferred embodiment, a first filter section 3a includes an inductor L13. In other words, the inductor L13 is connected between a serial arm and a reference potential in the first filter section 3a. Other elements of the composite filter device 51 are the same as or similar to those of the composite filter device 41.

As in the present preferred embodiment, the inductor L13 may be connected between the serial arm and the reference potential also in the first filter section 3a. In this case, it is preferable for the inductor L13 to have a larger inductance value than the inductance values of the inductors L11 and L12 provided in the second filter section 3b. With this structure, attenuation at a lower frequency side spaced from the pass band is sufficiently small.

Figure 13:
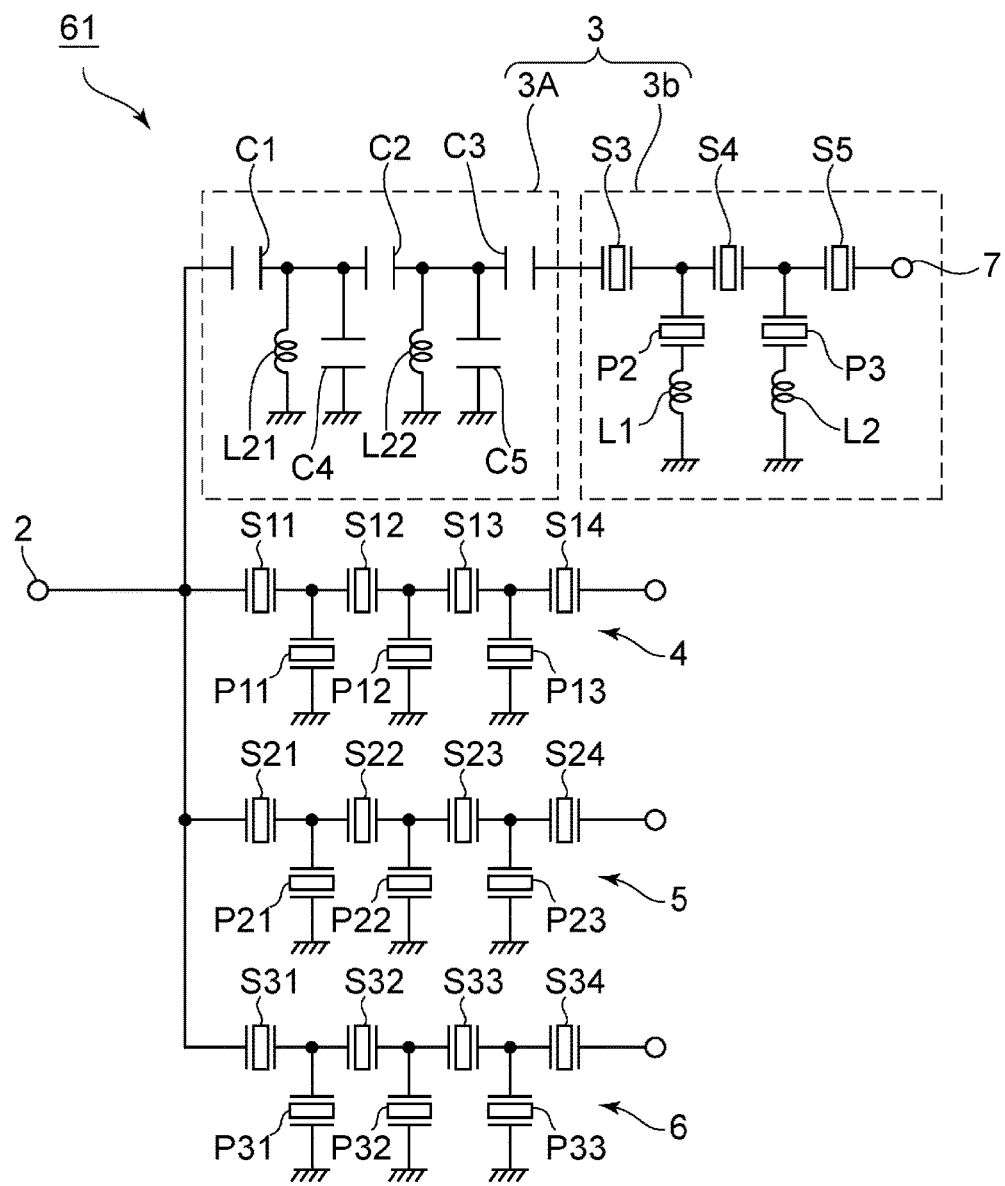
FIG. 13 is a circuit diagram of a composite filter device according to a sixth preferred embodiment of the present invention.

FIG. 13 is a circuit diagram of a composite filter device according to a sixth preferred embodiment of the present invention. A composite filter device 61 is configured in the same or similar manner as the composite filter device 1 of the first preferred embodiment except that, in a first band pass filter 3, a first filter section 3A is defined by an LC filter. The first filter section 3A includes, in a serial arm thereof, capacitors C1, C2, and C3 connected in series to each other. An inductor L21 and a capacitor C4 are each connected between a reference potential and a portion of the serial arm between the capacitors C1 and C2. In addition, an inductor L22 and a capacitor C5 are each connected between the reference potential and a portion of the serial arm between the capacitors C2 and C3. In this manner, the first filter section 3A defined by the LC filter may be used as the first filter section in the first band pass filter 3.

The circuit configuration of the first filter section 3A defined by the LC filter may be appropriately changed in the target filter characteristics as long as at least one capacitor and at least one inductor are included.

Figure 14:
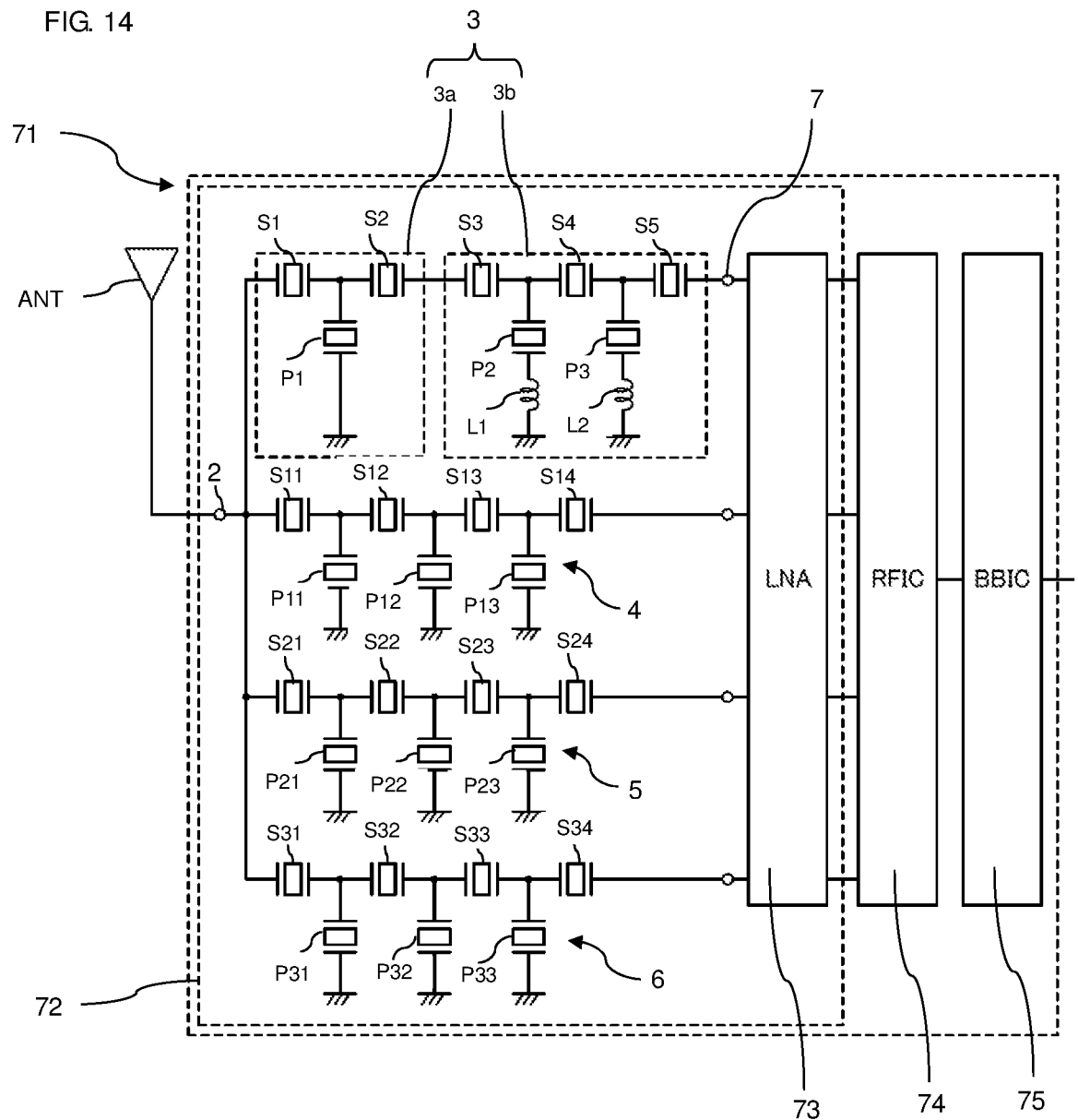
FIG. 14 is a circuit diagram of a high-frequency front end circuit and a communication device including a composite filter device according to a preferred embodiment of the present invention.

FIG. 14 is a circuit configuration diagram of a high-frequency front end circuit 72 and a communication device 71 including the composite filter device according to the first preferred embodiment. This diagram illustrates the high-frequency front end circuit 72, an antenna element ANT, an amplification circuit (LNA) 73, an RF signal processing circuit (RFIC) 74, and a baseband signal processing circuit (BBIC) 75. The high-frequency front end circuit 72, the RF signal processing circuit 74, and the baseband signal processing circuit 75 define the communication device 71.

Although, in the first to sixth preferred embodiments, the first to fourth band pass filters 3 to 6 are connected to the antenna terminal 2, the number of band pass filters connected to the antenna terminal 2 is not limited thereto. No less than five band pass filters may be bundled at one side of each thereof, or two or three band pass filters may be bundled at one side of each thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
a first filter section including a ladder circuit including at least one first serial arm resonator and at least one first parallel arm resonator, the at least one first serial arm resonator and the at least one first parallel arm resonator each being defined by an acoustic wave resonator; and
a second filter section connected to the first filter section and including a ladder circuit including at least one second serial arm resonator and at least one second parallel arm resonator, the at least one second serial arm resonator and the at least one second parallel arm resonator each being defined by an acoustic wave resonator; wherein
a fractional bandwidth of the second filter section is smaller than a fractional bandwidth of the first filter section;
the first filter section includes or does not include at least one first inductor connected between the at least one first parallel arm resonator and a reference potential;
the second filter section includes at least one second inductor connected between the at least one second parallel arm resonator and the reference potential; and
an inductor having a largest inductance value among the at least one first inductor and the at least one second inductor each connected between the at least one first parallel arm resonator or the least one second parallel arm resonator and the reference potential is included in the second filter section.

2. The acoustic wave filter device according to claim 1, wherein attenuation in a predetermined attenuation region adjacent to a pass band in the second filter section is larger than attenuation in an attenuation region adjacent to a pass band in the first filter section.

3. The acoustic wave filter device according to claim 1, wherein the first filter section and the second filter section each respectively include the at least one first inductor and the at least one second inductor respectively connected between the at least one first parallel arm resonator or the at least one second parallel arm resonator and the reference potential.

4. The acoustic wave filter device according to claim 3, wherein any inductance value of the at least one second inductor provided in the second filter section is larger than any inductance value of the at least one first inductor provided in the first filter section.

5. The acoustic wave filter device according to claim 3, wherein, of the at least one second inductor provided in the second filter section, an inductor located farthest from the first filter section has the largest inductance value.

6. The acoustic wave filter device according to claim 1, wherein the second filter section includes an acoustic wave resonator with a smallest fractional bandwidth, in the first and second filter sections.

7. The acoustic wave filter device according to claim 1, wherein
the first filter section includes the ladder circuit including the acoustic wave resonators; and
any fractional bandwidth of the acoustic wave resonators provided in the first filter section is larger than the fractional bandwidth of the acoustic wave resonators provided in the second filter section.

8. A composite filter device comprising:
a plurality of band pass filters connected in common at one end of each of the plurality of band pass filters; wherein
at least one of the plurality of band pass filters is defined by the acoustic wave filter device according to claim 7, and includes a first band pass filter having a first pass band and a second band pass filter having a second pass band different from the first pass band.

9. The acoustic wave filter device according to claim 1, wherein each of the first and second filter sections is a surface acoustic wave filter.

10. The acoustic wave filter device according to claim 1, wherein
the first filter section includes the ladder circuit including the acoustic wave resonators; and
an acoustic wave mode used in the first filter section differs from an acoustic wave mode used in the second filter section.

11. The acoustic wave filter device according to claim 1, wherein the first and second filter sections each include a piezoelectric body and an electrode provided on the piezoelectric body, and the first filter section differs from the second filter section in at least one of a material of the electrode, a material of the piezoelectric body, a composition ratio of the material of the piezoelectric body, a crystal orientation of the piezoelectric body, and a cut-angle of the piezoelectric body.

12. The acoustic wave filter device according to claim 1, wherein the first and second filter sections each include a piezoelectric body, an electrode provided on the piezoelectric body, and a dielectric film covering the electrode, and the first filter section differs from the second filter section in at least one of a thickness of the electrode and a thickness of the dielectric film.

13. A composite filter device comprising:
a plurality of band pass filters connected in common at one end of each of the plurality of band pass filters; wherein
at least one of the plurality of band pass filters is defined by the acoustic wave filter device according to claim 1, and includes a first band pass filter having a first pass band and a second band pass filter having a second pass band different from the first pass band; and
the second pass band is positioned on a higher frequency side than the first pass band.

14. A high-frequency front end circuit device comprising:
the composite filter device according to claim 13; and
an amplification circuit connected to the composite filter device.

15. A communication device comprising:
the high-frequency front end circuit device according to claim 14;
an RF signal processing circuit; and
a baseband signal processing circuit.

16. An acoustic wave filter device comprising:
a first filter section including a first ladder circuit; and
a second filter section connected to the first filter section and including a second ladder circuit including at least one serial arm resonator and at least one parallel arm resonator, the at least one serial arm resonator and the at least one parallel arm resonator each being defined by an acoustic wave resonator; wherein
the first filter section is connected between an antenna terminal and the second filter section;
an inductor connected between the at least one parallel arm resonator and a reference potential is provided in the second filter section;
the at least one parallel arm resonator is connected between a serial arm of the second filter section and the inductor; and
the first filter section does not include an inductor connected between a serial arm and the reference potential.

17. The acoustic wave filter device according to claim 16, wherein the first ladder circuit includes an acoustic wave resonator.

18. A composite filter device comprising:
a plurality of band pass filters connected in common at one end of each of the plurality of band pass filters; wherein
at least one of the plurality of band pass filters is defined by the acoustic wave filter device according to claim 16, and includes a first band pass filter having a first pass band and a second band pass filter having a second pass band different from the first pass band; and
the second pass band is positioned on a lower frequency side than the first pass band.

19. An acoustic wave filter device comprising:
a first filter section including a first ladder circuit; and
a second filter section connected to the first filter section and including a second ladder circuit including at least one serial arm resonator and at least one parallel arm resonator, the at least one serial arm resonator and the at least one parallel arm resonator each being defined by an acoustic wave resonator; wherein
an inductor connected between a serial arm and a reference potential is provided in the second filter section; and
attenuation in a predetermined attenuation region adjacent to a pass band in the second filter section is larger than attenuation in an attenuation region adjacent to a pass band in the first filter section.

20. The acoustic wave filter device according to claim 19, wherein the first filter section does not include an inductor connected between a serial arm and the reference potential.

21. An acoustic wave filter device comprising:
a plurality of band pass filters connected in common at one end of each of the plurality of band pass filters; wherein
one of the plurality of band pass filters includes:
a first filter section including a first ladder circuit; and
a second filter section connected to the first filter section and including a second ladder circuit including at least one serial arm resonator and at least one parallel arm resonator, the at least one serial arm resonator and the at least one parallel arm resonator each being defined by an acoustic wave resonator;
an inductor connected between a serial arm and a reference potential is provided in the second filter section;
the first filter section includes an inductor connected between a serial arm and the reference potential without another element interposed between the inductor and the serial arm or the reference potential;
the first filter section includes an inductor having a largest inductance value among the inductors each connected between the serial arm and the reference potential in the first and second filter sections; and
the inductor having the largest inductance value is connected closest to the one end among the inductors in the first and second filter sections.

22. The acoustic wave filter device according to claim 21, wherein any inductance value of the inductors each connected between the serial arm and the reference potential without another element interposed between the inductor and the serial arm or the reference potential in the first filter section is larger than any inductance value of the inductors each connected between the serial arm and the reference potential without another element interposed between the inductor and the serial arm or the reference potential in the second filter section.

23. An acoustic wave filter device comprising:
a first filter section including an LC filter including at least one first inductor and at least one first capacitor; and
a second filter section connected to the first filter section and including a ladder circuit including at least one second serial arm resonator and at least one second parallel arm resonator, the at least one second serial arm resonator and the at least one second parallel arm resonator each being defined by an acoustic wave resonator; wherein
a fractional bandwidth of the second filter section is smaller than a fractional bandwidth of the first filter section.

24. The acoustic wave filter device according to claim 23, wherein attenuation in a predetermined attenuation region adjacent to a pass band in the second filter section is larger than attenuation in an attenuation region adjacent to a pass band in the first filter section.

25. An acoustic wave filter device comprising:
a first filter section including a first ladder circuit; and
a second filter section connected to the first filter section and including a second ladder circuit including at least one serial arm resonator and at least one parallel arm resonator, the at least one serial arm resonator and the at least one parallel arm resonator each being defined by an acoustic wave resonator; wherein
an inductor connected between a serial arm and a reference potential is provided in the second filter section;
the first ladder circuit includes an acoustic wave resonator; and
the second filter section includes an acoustic wave resonator with a smallest fractional bandwidth, in the first and second filter sections.

26. An acoustic wave filter device comprising:
a plurality of band pass filters connected in common at one end of each of the plurality of band pass filters; wherein
one of the plurality of band pass filters includes:
a first filter section including a first ladder circuit; and
a second filter section connected to the first filter section and including a second ladder circuit including at least one serial arm resonator and at least one parallel arm resonator, the at least one serial arm resonator and the at least one parallel arm resonator each being defined by an acoustic wave resonator;
an inductor connected between a serial arm and a reference potential is provided in the second filter section;
the first filter section includes an LC filter including at least one inductor and at least one capacitor;
the first filter section is connected between the one end and the second filter section; and
the first filter section does not include any resonators.

* * * * *